(12) United States Patent
Asano et al.

(10) Patent No.: US 11,050,183 B2
(45) Date of Patent: Jun. 29, 2021

(54) ELECTRICAL DEVICE

(71) Applicant: TOYOTA JIDOSHA KABUSHIKI KAISHA, Toyota (JP)

(72) Inventors: Takashi Asano, Okazaki (JP); Yuichi Shimo, Toyota (JP); Kenjiro Shiba, Takahama (JP); Shinichi Miura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/808,945

(22) Filed: Mar. 4, 2020

(65) Prior Publication Data

US 2020/0328554 A1 Oct. 15, 2020

(30) Foreign Application Priority Data

Apr. 15, 2019 (JP) .............................. JP2019-077321

(51) Int. Cl.
| | |
|---|---|
| *H01R 13/52* | (2006.01) |
| *H01R 13/74* | (2006.01) |
| *H05K 5/06* | (2006.01) |
| *H05K 5/00* | (2006.01) |
| *B60R 16/03* | (2006.01) |

(52) U.S. Cl.
CPC ......... *H01R 13/5202* (2013.01); *B60R 16/03* (2013.01); *H01R 13/74* (2013.01); *H05K 5/0008* (2013.01); *H05K 5/061* (2013.01); *H05K 5/069* (2013.01); *H01R 2201/26* (2013.01)

(58) Field of Classification Search
None
See application file for complete search history.

(56) References Cited

U.S. PATENT DOCUMENTS

2017/0355272 A1 12/2017 Baba et al.
2018/0281605 A1 10/2018 Sawazaki et al.

FOREIGN PATENT DOCUMENTS

| JP | 2017-079547 A | 4/2017 |
| JP | 2017-222203 A | 12/2017 |
| JP | 2018-170894 A | 11/2018 |

*Primary Examiner* — Ross N Gushi
(74) *Attorney, Agent, or Firm* — Oliff PLC

(57) ABSTRACT

An electrical device may be provided with: a housing having a side surface; and a connector opening provided on the side surface of the housing and to which a connector is connected. The side surface includes a groove surrounding the connector opening, the connector includes a ring-shaped rib fitted into the groove, the connector has an upper surface and a lower surface that are inclined as viewed along a normal direction of the side surface, and a lower end of the lower surface includes a step protruding downward, the side surface includes a drain hole at a position below the step, and the drain hole communicates inside of the groove and underside of the groove.

4 Claims, 5 Drawing Sheets

ELECTRICAL DEVICE

CROSS-REFERENCE TO RELATED APPLICATION

This application claims priority to Japanese Patent Application No. 2019-77321 filed on Apr. 15, 2019, the contents of which are hereby incorporated by reference into the present application.

TECHNICAL FIELD

The teachings disclosed herein relate to an electrical device. Especially, the teaching disclosed herein relates to an improvement of drainage around a connector in the electrical device used in a situation where the device is splashed with water.

BACKGROUND

An electrical device to a side surface of which a connector is connected is known. For example, Japanese Patent Application Publication Nos. 2017-079547, 2017-222203, and 2018-170894 each describes such an electrical device. If an electrical device is used in a situation where the device may be splashed with water, there is a risk that adhesion of water to its connector may develop corrosion of a contact part between the connector opening and the connector. The electrical device in Japanese Patent Application Publication No. 2017-079547 provides an eave above a connector opening arranged on a side surface of the electrical device in order to prevent the contact part between the connector opening and the connector from being splashed with water. The present description terms an opening arranged on a housing of an electrical device and to which a connector is connected "a connector opening."

SUMMARY

Even provision of an eave may not completely prevent a connector from being splashed with water. The present description provides an electrical device with improved drainage around a connector.

An electrical device may comprise: a housing having a side surface; and a connector opening provided on the side surface of the housing and to which the connector is connected. The side surface includes a groove surrounding the connector opening. The connector includes a ring-shaped rib fitted into the groove. The connector has an upper surface and a lower surface that are inclined as viewed along a normal direction of the side surface. A lower end of the lower surface includes a step protruding downward. The side surface includes a drain hole at a position below the step. The drain hole communicates inside of the groove and underside of the groove.

Firstly, in the electrical device disclosed herein, the housing includes the groove surrounding the connector opening, and the connector includes the rib fitted into the groove. By the rib fitting into the groove, it becomes difficult for water to enter from between the connector opening and the connector. Secondly, the upper surface and the lower surface of the connector are inclined and the water adhering to the upper surface flows along the inclined surface, and drops off from the connector. The lower end of the connector inclined lower surface includes the step protruding downward, and the water flowing along the lower surface drops off from the step. The drain hole is provided below the step, and the water is drained out of the groove through the drain hole. Given the above, the structure as above improves drainage around the connector.

Details and further developments of the teachings disclosed herein will be described in "DETAILED DESCRIPTION."

DETAILED DESCRIPTION

Embodiment

Figure 1:
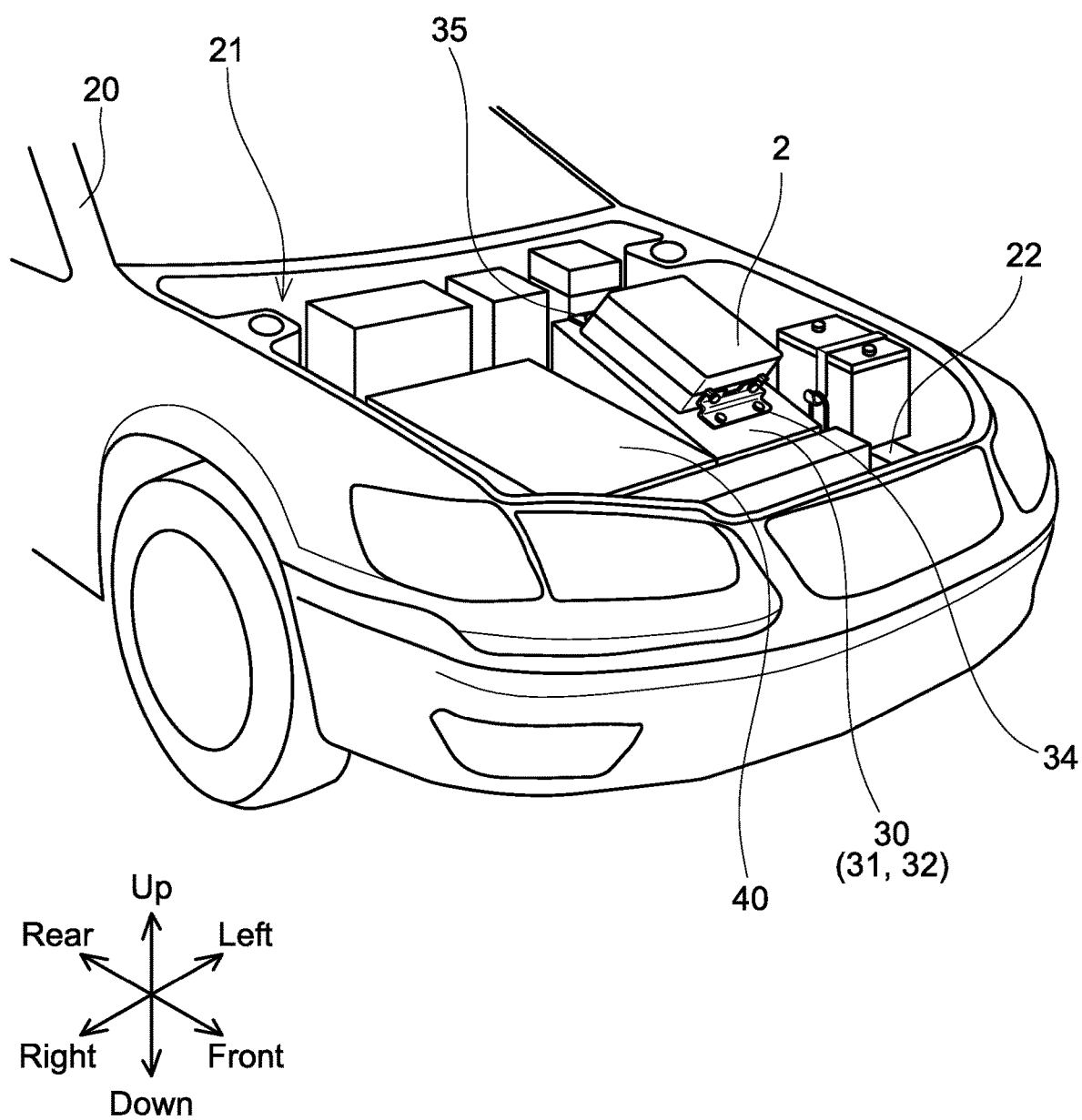
FIG. 1 is a perspective view of a front compartment in which an electrical device (power converter) according to an embodiment is installed.

An electrical device according to an embodiment will be described with reference to drawings. The electrical device according to the embodiment is a power converter 2 mounted in a hybrid vehicle 20. The power converter 2 is a device configured to convert battery power to driving power for two traction motors. The power converter 2 is installed in a front compartment 21 of the hybrid vehicle 20. FIG. 1 is a perspective view of the front compartment 21 of the hybrid vehicle 20. The power converter 2 is fixed on a transaxle 30 by a front bracket 34 and a rear bracket 35. A housing of the transaxle 30 houses traction motors 31, 32 therein. A coordinate system of FIG. 1 shows a front side, rear side, right side, left side, upper side, and lower side of the vehicle. The same coordinate system will be used throughout all drawings.

The transaxle 30 is connected to an engine 40. The transaxle 30 and the engine 40 are supported by a pair of side members 22 that extends in a front-rear direction of the vehicle. FIG. 1 does not show one of the side members, being hidden by the engine.

Figure 2:
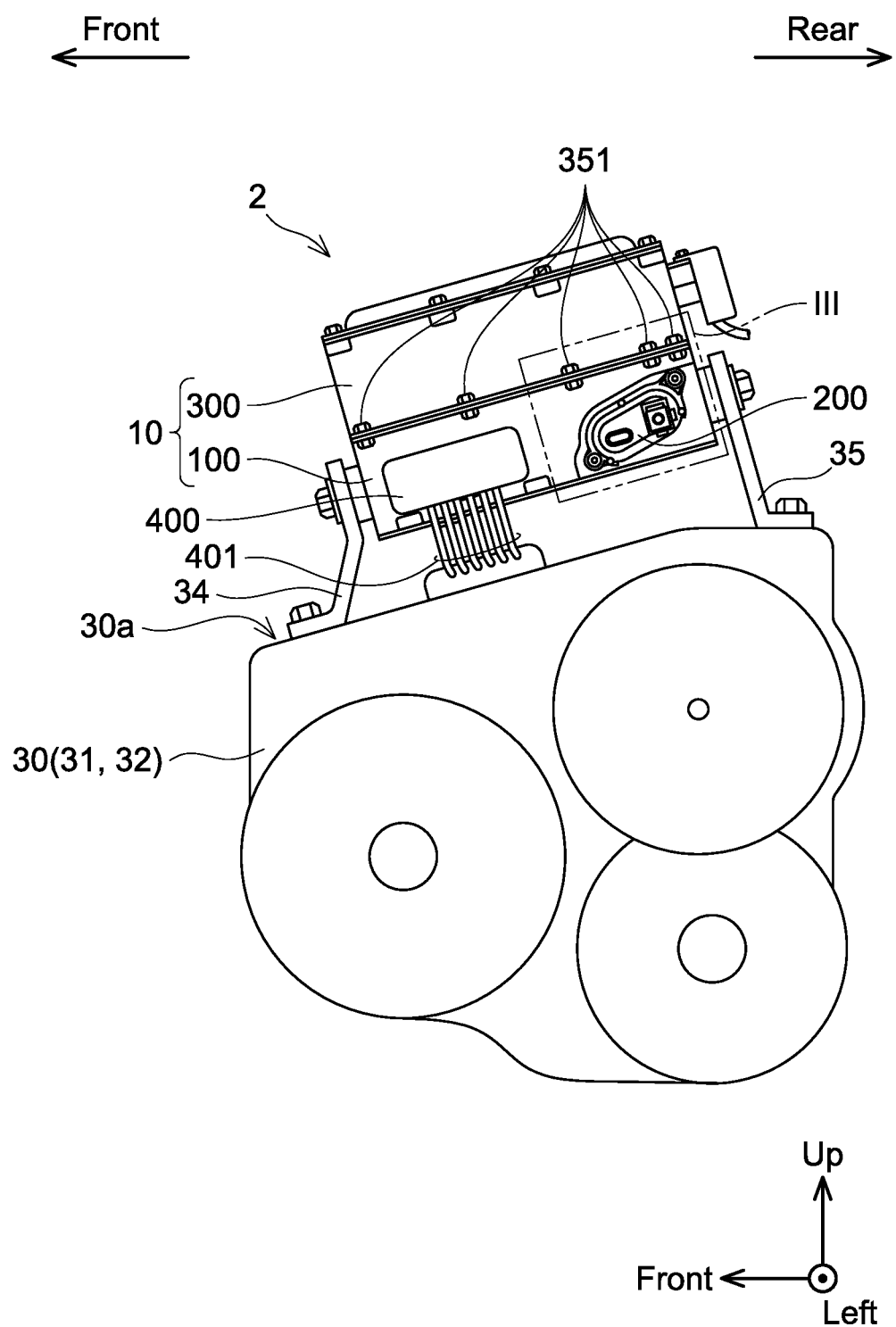
FIG. 2 is a side view of the power converter fixed on a transaxle.

FIG. 2 is a side view of the power converter 2 fixed on the transaxle 30. A housing 10 of the power converter 2 includes a lower housing 100 and an upper housing 300. The lower housing 100 and the upper housing 300 are joined by bolts 351.

As mentioned above, the housing 10 of the power converter 2 is fixed on the transaxle 30 by the front bracket 34 and the rear bracket 35. An upper surface 30*a* of the transaxle 30 is inclined downwardly to the front side, and the housing 10 is supported in its posture of being inclined downwardly to the front side. The front bracket 34 and the rear bracket 35 are connected to the lower housing 100.

Connectors 200 and 400 are connected to a side surface of the lower housing 100. Power cables 401 configured to supply power to the traction motors 31, 32 are connected to the connector 400. Power cables and signal lines are connected to the connector 200. The power cables connected to the connector 200 transmit low-voltage power. FIG. 2 omits illustration of the signal lines and the power cables that are connected to the connector 200.

Figure 3:
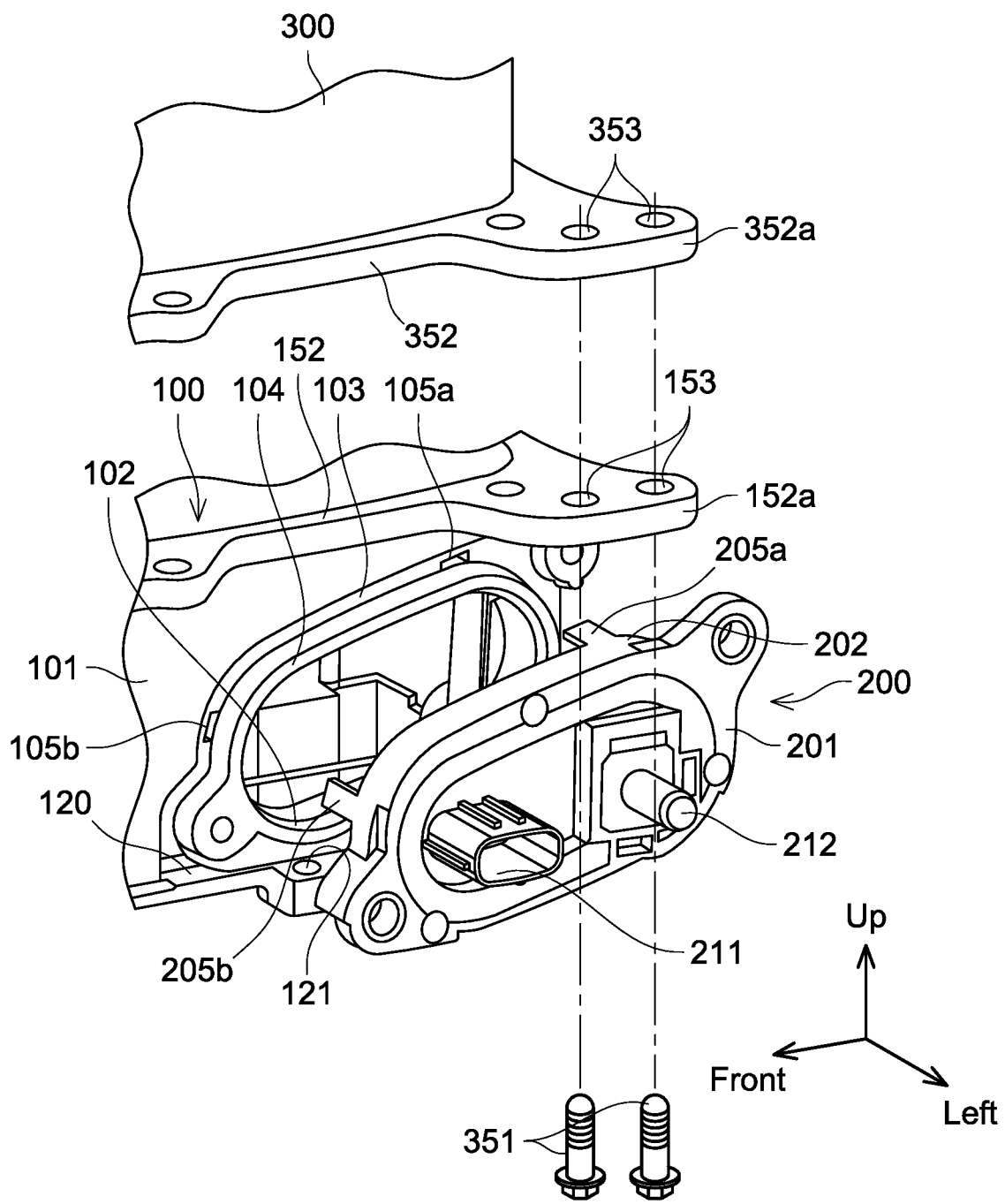
FIG. 3 is a perspective view that enlarges a section III of FIG. 2.

FIG. 3 is a perspective view that enlarges a section III in FIG. 2. FIG. 3 depicts a state where the connector 200 has been removed from the lower housing 100. A body 201 of the connector 200 is constituted of plastic. The body 201 includes a signal coupler 211 to which the signal lines are connected and a power coupler 212 to which the power cables are connected, however, the cables connected to those couplers are omitted. Although terminals connected to the signal coupler 211 and terminals connected to the power coupler 212 are disposed inside a connector opening 102, illustration of those terminals is also omitted.

A side surface 101 of the lower housing 100 comprises the connector opening 102. The connector 200 is connected to the connector opening 102. The side surface 101 includes a groove 103 that surrounds the connector opening 102.

A ring-shaped protrusion 104 is provided between the groove 103 and the connector opening 102. Further, a rib 120 is provided between the groove 103 and underside of the lower housing 100. In other words, the groove 103 and the connector opening 102 are separated from each other by the ring-shaped protrusion 104. The groove 103 and the underside of the lower housing 100 are separated by the rib 120. The rib 120 includes a drain hole 121 that communicates inside of the groove 103 and underside of the groove 103. The drain hole 121 will be described below.

Figure 4:
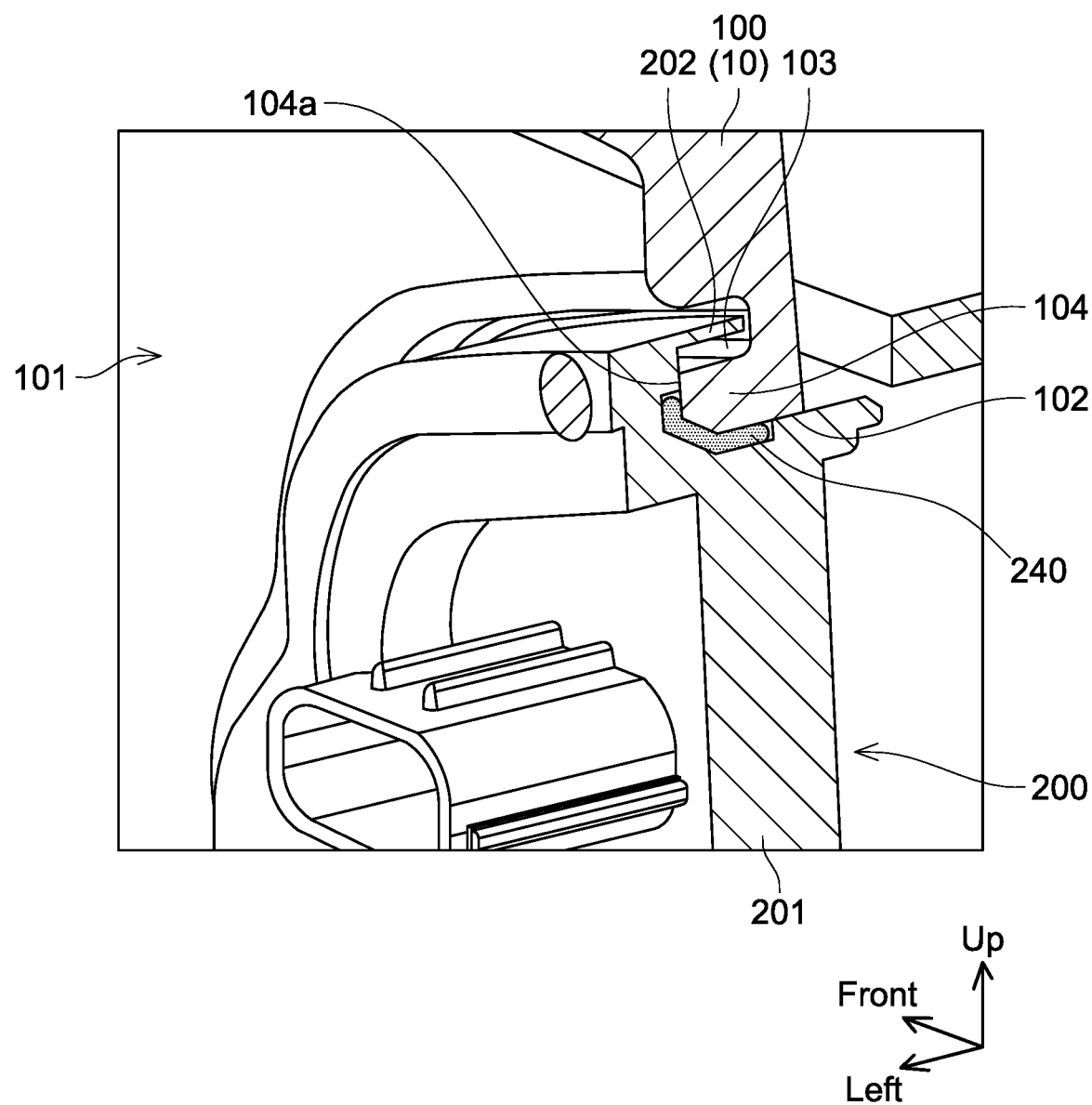
FIG. 4 is a cross-sectional view of a connector and its surroundings.

FIG. 4 illustrates a cross sectional view of the connector 200 and its surrounding configurations. As shown in FIG. 4, the body 201 of the connector 200 includes a ring-shaped rib 202 that fits into the groove 103. As aforementioned, a part interposed between the connector opening 102 and the groove 103 of the lower housing 100 forms the ring-shaped protrusion 104. As shown in FIG. 4, a tip surface 104a of the protrusion 104 is in contact with the body 201 of the connector 200 inside the rib 202. This structure makes it difficult for water to enter from the connector opening 102 to the inside of the housing 10.

Further, a ring-shaped sealer 240 is interposed between the protrusion 104 and the body 201. The sealer 240 prevents entry of water from between the connector opening 102 and the connector 200 to the inside of the housing 10. FIG. 4 hatches the sealer 240 in gray to aid understanding.

Referring back to FIG. 3, the description continues. Two projections 205a, 205b project from the rib 202 of the connector 200 toward the housing 10 (lower housing 100). The groove 103 of the housing 10 (lower housing 100) includes a depression 105a at a position facing the projection 205a, and includes a depression 105b at a position facing the projection 205b. When the connector 200 is coupled to the housing 10 (lower housing 100), the projection 205a fits into the depression 105a, and the projection 205b fits into the depression 105b. The projections 205a, 205b and the depressions 105a, 105b accurately define a position of the connector 200 relative to the connector opening 102. Provision of the projections 205a, 205b on a connector 200 side facilitates a work of attaching the connector 200 to the housing 10 (lower housing 100).

As aforementioned, the housing 10 includes the lower housing 100 and the upper housing 300, and these are joined by the plural bolts 351. As shown in FIG. 3, a flange 352 projecting laterally is provided at a lower end of the upper housing 300, and a flange 152 projecting laterally is provided at an upper end of the lower housing 100. Above the connector 200, a projection 152a projects laterally from the flange 152 and a projection 352a projects laterally from the flange 352. The projection 152a is provided with two bolt holes 153 and the projection 352a is provided with two bolt holes 353. The flange 152 (projection 152a) and the flange 352 (projection 352a) are joined to each other by the two bolts 351. Although the bolts 351 are inserted into the flange 152 (projection 152a) and the flange 352 (projection 352a) from below and nuts are attached from above, illustration of the nuts is omitted.

The flanges 152, 352 (projections 152a, 352a) that project from the housing 10 above the connector 200 also contribute to prevention of water adhesion to the connector 200.

Figure 5:
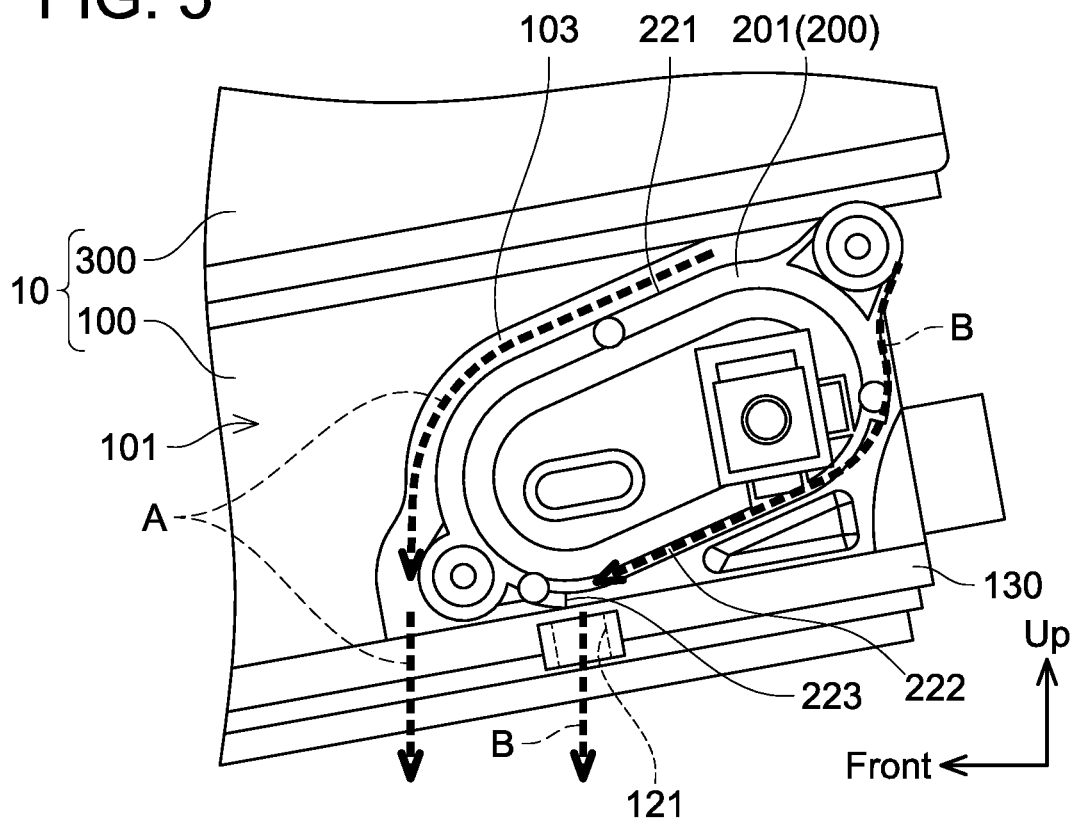
FIG. 5 is a side view of the connector and its surroundings.

FIG. 5 shows a view seeing the connector 200 along a normal direction of the side surface 101 of the lower housing 100. As well shown in FIG. 5, the connector 200 has an elliptical shape, and is mounted to the housing 10 in an orientation by which the elliptical shape is angled.

The upper surface 221 of the connector 200 is inclined such that its vehicle front side is lowered and its vehicle rear side is elevated. Similarly, the lower surface 222 of the connector 200 is inclined such that its vehicle front side is lowered and its vehicle rear side is elevated. Since the upper surface 221 is angled, water adhering to the upper surface 221 flows toward the lower side and drops off from the connector 200. Broken line arrows A in FIG. 5 show flow of water that runs along the upper surface 221 and drips off therefrom.

Figure 6:
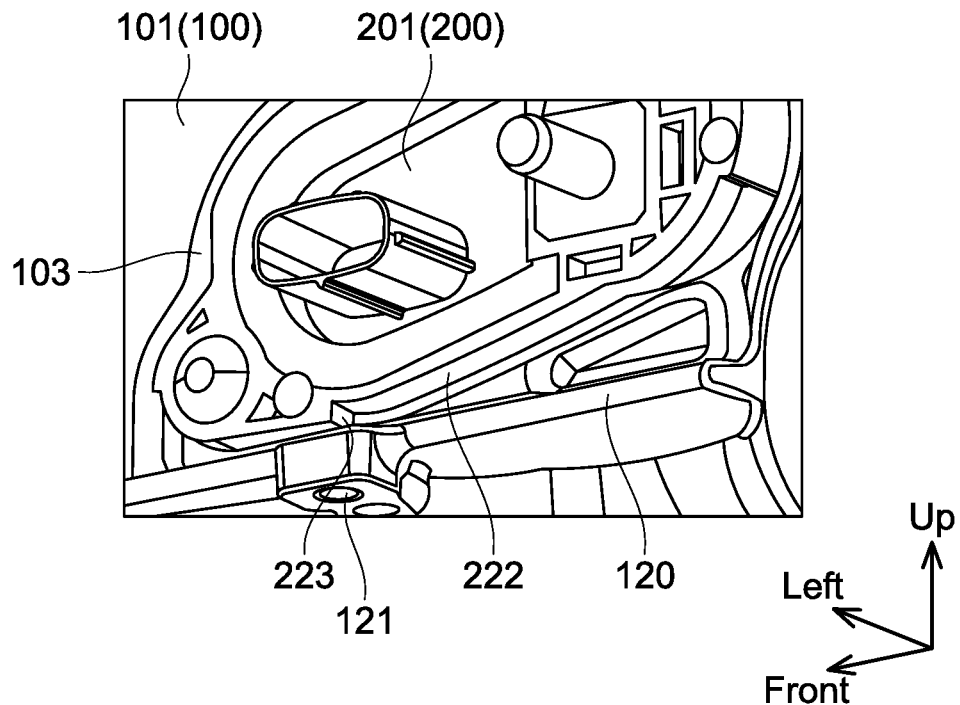
FIG. 6 is a view seeing the connector and its surroundings from diagonally below.

A step 223 that protrudes downward is provided at a lower end of the inclined lower surface 222. FIG. 6 shows a view seeing the connector 200 obliquely from below. FIG. 6 provides a good view of the step 223. As aforementioned, the lower housing 100 is provided with the rib 120, and the rib 120 is disposed below the connector 200. A space between the rib 120 and the connector 200 corresponds to the groove 103. As aforementioned, the rib 120 is provided with the drain hole 121. The drain hole 121 communicates the inside of the groove 103 and the underside of the groove 103. The drain hole 121 is disposed below the step 223 of the connector 200. The water running downward along the lower surface 222 of the connector 200 impinges on the step 223, and drops off therefrom. The drain hole 121 is disposed below the step 223, and the water that dropped off from the step 223 flows through the drain hole 121 and is drained out of the groove 103. Broken arrow lines B of FIG. 5 show flow of the water that runs along the lower surface 222 and drops off from the step 223.

As aforementioned, the water that adheres to the connector 200 drops off rapidly from the connector 200 by the inclined upper surface 221 and inclined lower surface 222 of the connector 200. The water running along the lower surface 222 drops off from the step 223. The water passes through the drain hole 121 below the step 223 and is drained out of the groove 103. Due to this, the water is prevented from remaining in the groove 103.

The power converter 2 has good water drainage around the connector 200. Some of structural features that improve the drainage around the connector 200 will be listed below.

The housing 10 includes the ring-shaped groove 103 surrounding the connector 200. The body 201 of the connector 200 includes the ring-shaped rib 202 that fits into the groove 103. The protrusion 104 is provided between the connector opening 102 and the groove 103, and its tip surface 104a of the protrusion 104 is in contact with the connector 200 inside the rib 202. Such structure makes it difficult for the water to enter from between the connector opening 102 and the connector 200 to the inside of the housing 10.

The sealer 240 is interposed between the connector opening 102 and the protrusion 104. The sealer 240 also prevents the water from entering from between the connector opening 102 and the connector 200.

The connector 200 has the elliptical shape as seen along the normal direction of the housing side surface (side surface 101) on which the connector 200 is mounted. The connector 200 is mounted on the housing 10 (connector opening 102) such that the elliptical is angled. As seen along the normal direction, the upper surface 221 and lower surface 222 of the connector 200 are angled. Due to this, the water adhering to the upper surface 221 or the lower surface 222 flows down along the angled surfaces.

The step 223 that projects downward is provided at the lower end of the inclined lower surface 222. The drain hole 121 is provided below the step 223. The drain hole 121 is provided in the rib 120 that separates the groove 103 and the underside of the housing. The water running along the lower surface 222 impinges on the step 223 and drops off therefrom. The water droplets that have dropped off from the step 223 are drained to the underside of the housing 10 through the drain hole 121.

The lower housing 100 includes the flange 152, and the projection 152a projects laterally from the flange 152 above the connector 200. The two bolts 351 are fixed to the projection 152a. The two bolts 351 connect the upper housing 300 and the lower housing 100. The flange 152 (projection 152a) projects outward like an eave above the connector 200. The flange 152 (projection 152a) contributes to the prevention of the water from adhering to the connector 200.

The two protrusions 205a, 205b extend from the rib 202 of the connector 200 toward the housing 10. The depression 105a is provided on a bottom of the groove 103 of the housing 10 so as to face the projection 205a, and the depression 105b is provided thereon so as to face the projection 205b. Upon mounting the connector 200 to the housing 10, the projections 205a, 205b fit into the depressions 105a, 105b. The projections 205a, 205b and the depressions 105a, 105b facilitate the work of mounting the connector 200.

Upon mounting the connector 200, the projections 205a, 205b fit into the depressions 105a, 105b. By the projections 205a, 205b fitting into the depressions 105a, 105b, the orientation of the connector 200 relative to the connector opening 102 can be precisely positioned. By further pressing the connector 200 in that state, the connector 200 can be mounted to the connector opening 102 easily and accurately. Accordingly, the work of mounting the connector 200 can be facilitated.

Since the connector 200 has the body 201 which has the elliptical shape, mounting the connector 200 to the connector opening 102 is difficult unless the posture of the body 201 is accurately positioned upon when the connector 200 is being mounted to the connector opening 102. The projections 205a, 205b and depressions 105a, 105b define the posture of the body 201 of the connector 200 accurately. The projections 205a, 205b and depressions 105a, 105b are especially effective for a connector that has a shape other than a square.

Some of points to be noted with regard to the teachings disclosed herein will be listed. The flange 152 (projection 152a) corresponds to an example of an eave above the connector 200. The power converter 2 is an example, and the teachings disclosed herein are not limited to the power converter 2, but are applicable to other types of electrical devices. The teachings disclosed herein are suitable for electrical devices that are used in a situation where the device may be splashed with water.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. An electrical device comprising:
a housing having a side surface;
a connector opening provided on the side surface of the housing and to which a connector is connected,
wherein
the side surface includes a groove surrounding the connector opening,
the connector includes a ring-shaped rib fitted into the groove,
the connector has an upper surface and a lower surface that are inclined as viewed along a normal direction of the side surface, and a lower end of the lower surface includes a step protruding downward,
the side surface includes a drain hole at a position below the step, and
the drain hole communicates inside of the groove and underside of the groove.

2. The electrical device according to claim 1, wherein
a ring-shaped protrusion is provided between the groove and the connector opening, and
a sealer is provided between the ring-shaped protrusion and the connector.

3. The electrical device according to claim 2, wherein a tip surface of the ring-shaped protrusion is in contact with the connector inside the ring-shaped rib.

4. The electrical device according to claim 1, wherein
the housing includes an upper housing and a lower housing,
the connector opening is provided on the lower housing,
the lower housing includes a flange protruding from the side surface at a position above the connector opening, and
the upper hosing is fixed to the flange by two bolts.

* * * * *